(12) United States Patent
Kanskar et al.

(10) Patent No.: US 10,833,474 B2
(45) Date of Patent: Nov. 10, 2020

(54) CTE-MATCHED SILICON-CARBIDE SUBMOUNT WITH HIGH THERMAL CONDUCTIVITY CONTACTS

(71) Applicant: nLIGHT, Inc., Vancouver, WA (US)

(72) Inventors: Manoj Kanskar, Portland, OR (US); Zhigang Chen, Portland, OR (US)

(73) Assignee: nLIGHT, Inc., Vancouver, WA (US)

( * ) Notice: Subject to any disclaimer, the term of this patent is extended or adjusted under 35 U.S.C. 154(b) by 0 days.

(21) Appl. No.: 16/052,517

(22) Filed: Aug. 1, 2018

(65) Prior Publication Data

US 2019/0044302 A1 Feb. 7, 2019

Related U.S. Application Data

(60) Provisional application No. 62/540,313, filed on Aug. 2, 2017.

(51) Int. Cl.
| | |
|---|---|
| *H01S 5/022* | (2006.01) |
| *H01S 5/323* | (2006.01) |
| *H01S 5/024* | (2006.01) |
| *H01L 23/00* | (2006.01) |
| *H01S 5/00* | (2006.01) |
| *H01S 5/40* | (2006.01) |

(52) U.S. Cl.
CPC .......... *H01S 5/02272* (2013.01); *H01L 24/32* (2013.01); *H01S 5/02476* (2013.01); *H01S 5/323* (2013.01); *H01L 2224/48091* (2013.01); *H01L 2224/73265* (2013.01); *H01L 2924/12042* (2013.01); *H01L 2924/19107* (2013.01); *H01S 5/005* (2013.01); *H01S 5/0014* (2013.01); *H01S 5/0071* (2013.01); *H01S 5/02252* (2013.01); *H01S 5/02276* (2013.01); *H01S 5/02284* (2013.01); *H01S 5/02469* (2013.01); *H01S 5/4012* (2013.01)

(58) Field of Classification Search
CPC ............ H01S 5/02469; H01S 5/02476; H01S 5/0226; H01S 5/02272; H01S 5/0215; H01S 5/0216; H01S 5/021; H01S 5/323–32316; H01S 5/343–34313; H01S 5/34353; H01L 23/3738; H01L 23/3736; H01L 23/3735; H01L 2224/73265
See application file for complete search history.

(56) References Cited

U.S. PATENT DOCUMENTS

| | | | | |
|---|---|---|---|---|
| 6,735,230 B1 * | 5/2004 | Tanabe | ................... | B82Y 20/00 372/43.01 |
| 6,743,702 B2 * | 6/2004 | Goto | ..................... | H01S 5/0425 257/E21.172 |
| 6,744,075 B2 * | 6/2004 | Yamaguchi | ............. | H01L 33/40 257/103 |

(Continued)

FOREIGN PATENT DOCUMENTS

CN 107403773 A * 11/2017 ............. H01L 23/48

OTHER PUBLICATIONS

"SiC Substrates," II-VI Advanced Materials, 4 pages (May 2015).

*Primary Examiner* — Joshua King
(74) *Attorney, Agent, or Firm* — Klarquist Sparkman, LLP

(57) ABSTRACT

Laser diode submounts include a SiC substrate on which a thick conductive layer is supplied to use in mounting a laser diode. The thick conductive layer is typically gold or copper, and can be electrically coupled to a base laser that is used to define laser diode couplings.

21 Claims, 13 Drawing Sheets

(56) References Cited

U.S. PATENT DOCUMENTS

| | | | | |
|---|---|---|---|---|
| 6,965,552 B2* | 11/2005 | Tokuda | G11B 7/127 | 228/180.22 |
| 8,378,357 B2* | 2/2013 | Zimmer | C04B 37/006 | 257/77 |
| 9,246,311 B1* | 1/2016 | Raring | H01S 5/22 | |
| 2002/0181526 A1* | 12/2002 | Gao | H01S 5/02276 | 372/45.01 |
| 2003/0207146 A1* | 11/2003 | Sasaki | H01L 23/498 | 428/627 |
| 2004/0201029 A1* | 10/2004 | Yamane | H01L 24/83 | 257/99 |
| 2004/0213315 A1* | 10/2004 | Kume | B82Y 20/00 | 372/50.1 |
| 2006/0249745 A1* | 11/2006 | Chae | B82Y 20/00 | 257/99 |
| 2009/0147816 A1* | 6/2009 | Iga | B82Y 20/00 | 372/50.12 |
| 2009/0200571 A1* | 8/2009 | Ishida | B82Y 20/00 | 257/99 |
| 2009/0218583 A1* | 9/2009 | Ishida | H01L 33/0079 | 257/98 |
| 2010/0046563 A1* | 2/2010 | Sato | H01S 5/02476 | 372/38.05 |
| 2010/0124246 A1* | 5/2010 | Lutgen | H01L 33/0095 | 372/50.1 |
| 2010/0254421 A1* | 10/2010 | Iga | H01S 5/4031 | 372/46.01 |
| 2011/0070695 A1* | 3/2011 | Bayerer | H01L 24/83 | 438/107 |
| 2012/0074563 A1* | 3/2012 | Iizuka | H01L 24/81 | 257/737 |
| 2012/0080800 A1* | 4/2012 | Shinohara | H01L 24/49 | 257/773 |
| 2012/0112201 A1* | 5/2012 | Otsuka | B23K 35/0238 | 257/76 |
| 2012/0218714 A1* | 8/2012 | Robert | H01L 23/053 | 361/713 |
| 2013/0022069 A1* | 1/2013 | Lee | H01S 5/02292 | 372/38.02 |
| 2014/0001619 A1* | 1/2014 | Yoo | H01L 23/142 | 257/676 |
| 2014/0284088 A1* | 9/2014 | Nakamura | H05K 1/092 | 174/257 |
| 2014/0321491 A1* | 10/2014 | Sakata | H01S 5/02276 | 372/44.01 |
| 2015/0146399 A1* | 5/2015 | Viswanathan | B23K 35/0244 | 361/785 |
| 2015/0249122 A1* | 9/2015 | Hironaka | C30B 25/186 | 257/76 |
| 2016/0118767 A1* | 4/2016 | Yoneda | H01S 5/02272 | 372/44.01 |
| 2016/0152004 A1* | 6/2016 | Niino | B32B 15/01 | 428/663 |
| 2016/0284664 A1* | 9/2016 | Hohlfeld | C04B 37/00 | |
| 2016/0352070 A1* | 12/2016 | Ovtchinnikov | H05K 3/0026 | |
| 2016/0359295 A1* | 12/2016 | Lee | H01S 5/02268 | |
| 2017/0352607 A1* | 12/2017 | Kooriyama | H01L 23/12 | |
| 2018/0226772 A1* | 8/2018 | Ikeda | H01S 5/02272 | |
| 2018/0278016 A1* | 9/2018 | Hagimoto | H01S 5/02476 | |
| 2019/0124774 A1* | 4/2019 | Li | H01L 23/28 | |
| 2019/0229031 A1* | 7/2019 | Takahashi | H01L 23/3107 | |

* cited by examiner

FIG. 8A
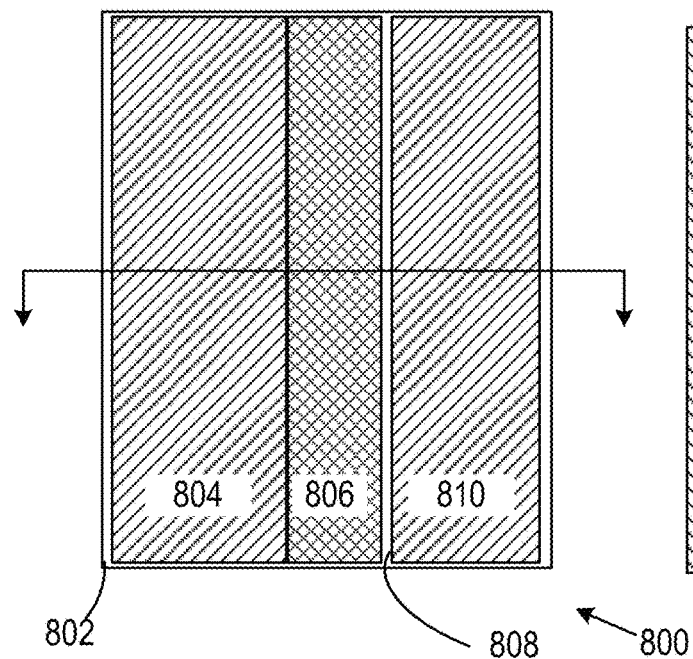
FIG. 8C
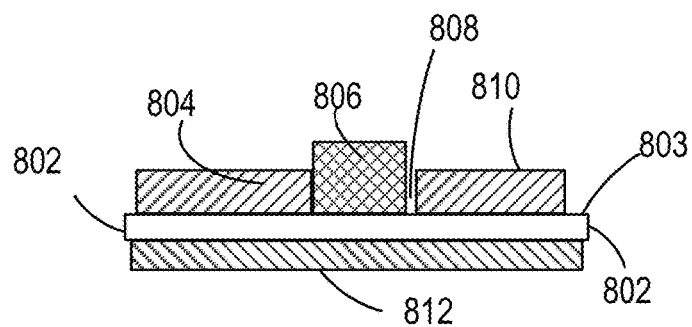
FIG. 8B

CTE-MATCHED SILICON-CARBIDE SUBMOUNT WITH HIGH THERMAL CONDUCTIVITY CONTACTS

CROSS REFERENCE TO RELATED APPLICATION

This application claims the benefit of U.S. Provisional Application No. 62/540,313, filed Aug. 2, 2017, which is hereby incorporated by reference in its entirety.

FIELD

The disclosure pertains to laser diode mounting.

BACKGROUND

High power laser diodes require submounts that permit efficient heat dissipation for reliable operation. While various substrates can be used, many substrates have poor thermal conductivities or unacceptable coefficients of thermal expansion (CTEs). CTE mismatches require the use of soft solders for laser diode mounting, resulting in unreliable devices. Alternative approaches are needed that provide high thermal conductivity and superior CTE matching to permit the use of soft or hard solders with a range of metallizations.

SUMMARY

Laser diode submounts comprise a thermally conductive, insulating substrate. A first contact, a second contact, and a bonding contact are situated on a major surface of the substrate, wherein the first contact and the bonding contact are electrically coupled to each other and insulated from the second contact. The bonding contact includes a thermally conductive layer of thickness of at least 0.5 µm. In some examples, the first contact and the bonding contact include respective portions of a common base layer and the substrate is silicon carbide. The thermally conductive layer is typically gold or copper and the common base layer comprises layers of titanium, platinum, and gold.

Devices comprise a silicon carbide substrate having a major surface and first conductive contact layers and second conductive contact layers situated on the major surface. The first conductive contact layers and the second conductive contact layers are separated by an insulating gap. A bonding contact is situated on the major surface of the silicon substrate or a portion of the silicon substrate covered by the first conductive contact layers, and is conductively coupled to the first conductive contact layers. The bonding contact includes at least one conductive layer of thickness greater than 0.5 µm and a laser diode is secured and electrically coupled to the bonding contact, typically with a solder layer. In some examples, the first conductive contact layers and second conductive contact layers include a common set of conductive base layers, and the common set of conductive base layers includes layers of Ti, Pt, and Au. In some examples, the Au layer has a thickness of between 1 and 100 µm. In other examples, copper is used instead of or in combination with gold.

Methods comprise forming a set of conductive base layers on a major surface of a SiC substrate and defining a first contact and a second contact by forming an insulating gap between a first area and a second area of the major surface. The first area and the second area are associated with corresponding portions of the conductive base layers. A bonding contact is electrically coupled to the first contact, wherein the bonding contact includes a thermally conductive layer of thickness of at least 0.5 µm. At least one laser diode is bonded and electrically coupled to the bonding contact. Typically, the bonding contact includes at least one Au or Cu layer of thickness of at least 1 µm.

Devices comprise a substrate and first, second, and bonding contacts situated on a major surface of a substrate, wherein the first contact is electrically coupled to the bonding contact and insulated from the second contact. A laser diode is secured and electrically coupled to the bonding contact, wherein a coefficient of thermal expansion (CTE) of a semiconductor material associated with the laser diode and a CTE of the substrate are matched. In some examples, the bonding contact includes a thick layer of one or more of gold and copper.

The foregoing and other objects, features, and advantages of the disclosed technology will become more apparent from the following detailed description, which proceeds with reference to the accompanying figures.

BRIEF DESCRIPTION OF THE DRAWINGS

FIGS. 8A-8D illustrate a representative laser submount.

DETAILED DESCRIPTION

Figure 1:
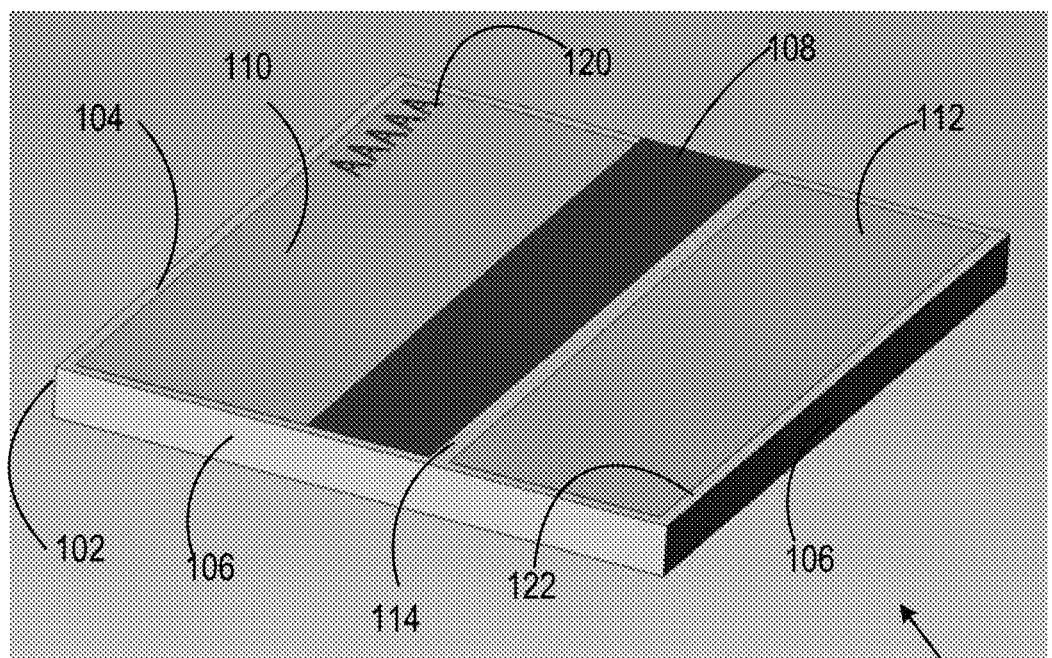
FIG. 1 is a perspective view of a representative laser submount.

Submounts that can be used to dissipate heat from high-power laser diodes can be based on Cu, BeO, CuW and AlN substrates having respective thermal conductivities of 400 W/mK, 290 W/mK, 220 W/mK, and 180 W/mK, respectively. The coefficients of thermal expansion (CTEs) of these materials are $17 \times 10^{-6}/C$, $7.3 \times 10^{-6}/C$, $8 \times 10^{-6}/C$ and $4.5 \times 10^{-6}/C$, respectively. While CuW, BeO and AlN can be considered to be CTE-matched to GaAs with CTE of about $6 \times 10^{-6}/C$, Cu is not. For this reason, the use of Cu is requires soft solders and, therefore, has limited reliability. The other three submounts materials accommodate robust, hard solders such as AuSn but have poorer thermal conductivity than Cu. Furthermore, BeO and AlN are electrically non-conducting, and a thin layer of copper-cladding or a thin metallization stack of Ti/Pt/Au layers is applied to these submounts to provide electrical connections for p- and n-contacts to a laser diode. CuW is CTE-matched to GaAs and electrically conducting but thermally inferior to Cu. Ceramic submounts are also nearly CTE-matched but have lower thermal conductivities than Cu. In any case, Cu or metal-stacks used for electrical contacts must be carefully chosen to preserve CTE-matching. Disclosed herein are submounts and associated methods and devices that can provide high thermal conductivities with superior CTE-matching for use with Cu or other conductor layers and hard or soft solders.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not necessarily imply any particular spatial orientation.

For convenient description, the terms "electrode" or "contact" refer to conductive layers (typically metallic) that are situated on or along a surface of a semiconductor chip in which one or more laser diodes are defined. In some cases, electrodes or contacts are referred to as "cathodes" or "anodes" depending on whether they couple directly to an n-doped or a p-doped region. For convenient description "contact" often refers to conductors or conductive layers that are typically defined on a laser diode mount (or submount) and that are electrically connected to laser diode electrodes. In some cases, conductors such as bond wires extend between an electrodes and a contact to provide electrical connection. A contact that is situated between laser diode semiconductor layers and a submount is referred to as a "bottom contact," and a contact that is exposed and suitable for wirebonding or other electrical connection is referred to as a "top contact." In some cases, a bottom contact, a top contact, or other contact comprises one more layers that serve to promote laser adhesion to a submount by soldering or other process, form Ohmic contacts with the laser semiconductor, or promote adhesion to a submount.

As used herein, "laser diode" or "laser diode chip" refers to a semiconductor structure in which a laser gain region is defined, typically a semiconductor substrate with an arrangement of doped and/or undoped layers, with or without electrodes. In typical examples, a laser diode is secured to a submount and includes first and second electrodes (a cathode and an anode), generally situated on the semiconductor layer stack in which a laser diode is formed, and first and second contacts (a top contact and a bottom contact). In some cases, the term "base layer" is used to refer to a layer or layers that promotes soldering, adhesion, or other physical and/or electrical coupling to a substrate, and can serve as an electrical contact. In some cases, base layer refers to layers or sets of layers nearest a major surface of a substrate. As used herein, "major surface" typically refers to a surface of a substrate having a relatively large area to distinguish edge or edge-like surfaces. A "submount" generally refers to a substrate having conductive layers that provide electrical connections and laser chip bonding, and does not necessarily include the laser itself. Layers provided to define a submount are generally provided prior to bonding of the laser to the submount, but some layers can be formed after laser bonding.

In some examples, specific values for material properties such as CTE are used. These values are provided for purposes of illustration, and actual material values can vary based on exact composition, fabrication method, material alignment, and other considerations.

In one example, the substrate is single crystal, semi-insulating (SI) silicon-carbide (SiC) with patterned copper and other metallic layers to provide electrical contacts. Single crystal SiC substrates typically have thermal conductivities of ~490 W/mK in-plane and ~390 W/mK thru-plane. Thus, SiC's in-plane thermal conductivity is higher than that of copper and SiC's thermal conductivity in the thru-plane direction it is almost the same as that of copper. Effective global thermal conductivity is higher than that of Cu.

Silicon carbide's CTE is $\sim 4 \times 10^{-6}$/C and is thus considered as matched to GaAs which has a CTE of about $6.86 \times 10^{-6}$/C. As used herein, two CTEs are referred to as matched if the absolute value of the difference between the two CTEs is less than 2.0, 1.5, 1.0, $0.5 \times 10^{-6}$/C. Differences of CTEs within these ranges can result in tensile or compressive stresses, but within an acceptable range. Such matching does not completely eliminate different temperature responses, but such matched CTEs tend to reduce or eliminate defects or other issues that mounted laser diode devices can exhibit in response to thermal cycles. Generally, materials with large thermal conductivities are preferred. As used herein, a large thermal conductive is any thermal conductivity greater than 200 W/mK, 250 W/mK. 300 W/mK, 350 W/mK, or 400 W/m.

Semi-insulating substrates for submounts tend to be simpler to integrate even though electrical isolation of the substrate or the laser from the substrate is not required. In typical examples, a laser diode chip is soldered over a SiC substrate with a sufficiently thick metal stack to provide electrical contact to the p-side of the diode, but other arrangements and orientations can be used. Thicker patterned copper layers or conductor portions are generally used elsewhere (as contacts or electrodes) to bring current to the laser diode p-side and n-side with reduced Joule-heating, i.e., reduced $I^2R_s$ loss, wherein I is laser drive current and $R_s$ is an electrode or contact resistance. The disclosed SiC submounts generally have higher thermal conductivities than conventional submounts while providing CTE-matching and reduced Joule heating losses in the electrical traces.

Laser diodes are generally secured to submounts with a solder such as a hard solder or a soft solder. As used herein, soft solders include indium, while hard solders include eutectic AuSn solder. Hard solders provide a stronger bond than soft solders and involve higher melting temperatures of the solder material. In the following, one or more layers such as layers of Pt, Sn, Au, Cu, TI or other conductive layers are used to define electrical contacts and laser bonding contacts. Cu is not CTE-matched, but in some examples, laser diodes are secured to conductive layer stacks having one or more relatively thick Cu layers without introducing significant laser beam depolarization resulting from thermal stress. Typically, multiple layers of different materials are used, and for convenience herein, the term "layer" refers to one or more layers (such as a set of layers) unless otherwise specified. References to layers of a single material refer to a single layer. Gold is a convenient top-most layer as it is suitable for both wirebonding and soldering.

Conductive layers are also provided to a backside (non-laser mounting side) of submount substrates for securing the submounts to other supports. Such backside layers need not exhibit low resistance as they are typically not used for electrical connections. Conductive layers having thicknesses of greater than or equal to 2500 nm, 5000 nm, 7500, 10000 nm, 15000 nm, 20000 nm, or more are referred to as "thick" layers. Such thick layers can provide superior electrical and thermal coupling, but can exacerbate stresses due to CTE mismatches.

Example 1

With reference to FIG. 1, a representative submount 100 includes a substrate 102 having a major surface 104. As noted above, major surface typically refers to a surface of a substrate having a relatively large area to distinguish edge or edge-like surfaces such as edge surface 106. A laser bonding contact 108 is situated on the major surface 104 between a first contact 110 and a second contact 112. The laser bonding contact 108 can also include the same or different conductive layers than the first contact 110 and the second contact 112. The laser bonding contact 108 and the first contact 110 are conductively coupled, and typically provide a low resistance current path (and generally share one or more conductive layers). The laser bonding contact 108 is separated from the second contact 112 by a gap 114. For convenience, an area 120 can be used to provide labels for part identification, orientation, or alignment. As shown in FIG. 1, a perimeter surface portion 122 of the major surface 104 is free of metallization.

The first contact 110 and the second contact 112 can be formed of any conductor such as, for example, gold, copper, or others. For convenient fabrication, the first contact 110 and the second contact 112 are formed by depositing and patterning a single conductive layer or set of conductive layers such as Au, Pt, Ti, and Cu layers. Similarly, the laser bonding contact 108 can be formed on the major surface 104 to cover substantially the entire major surface 104, and then patterned to define the gap 114 and leave a portion on which the second contact 112 can be formed.

The laser bonding contact 108 can be selected to promote soldering of a laser diode chip, to form an electrical connection such as an Ohmic contact to the laser chip, or to promote adhesion of other layers to the major surface 104. Thicknesses of the first contact 110 and the second contact 112 can be selected to provide electrical coupling of laser drive currents to a laser diode with a selected resistance and to promote thermal conduction to the substrate 102. Preferably, the substrate 102 has suitable thermal conductivities, and SiC is used in one example. To provide thermal coupling, the laser bonding contact 108 generally includes a thick layer of a suitable thermal conductor such as gold or copper.

Example 2

Figure 2A:
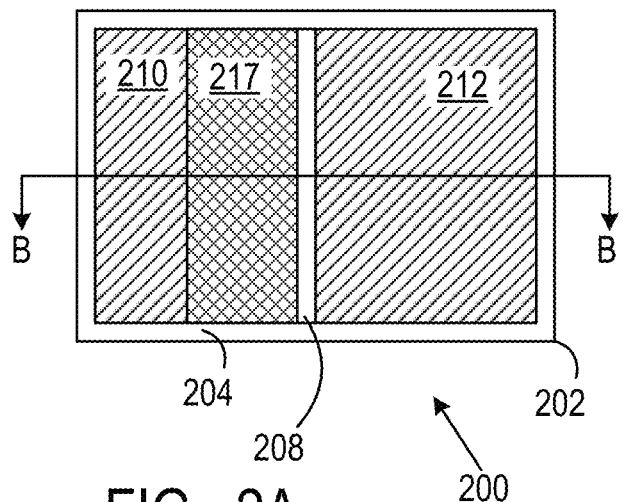
FIGS. 2A-2C are views of a representative laser submount.
Figure 2B:
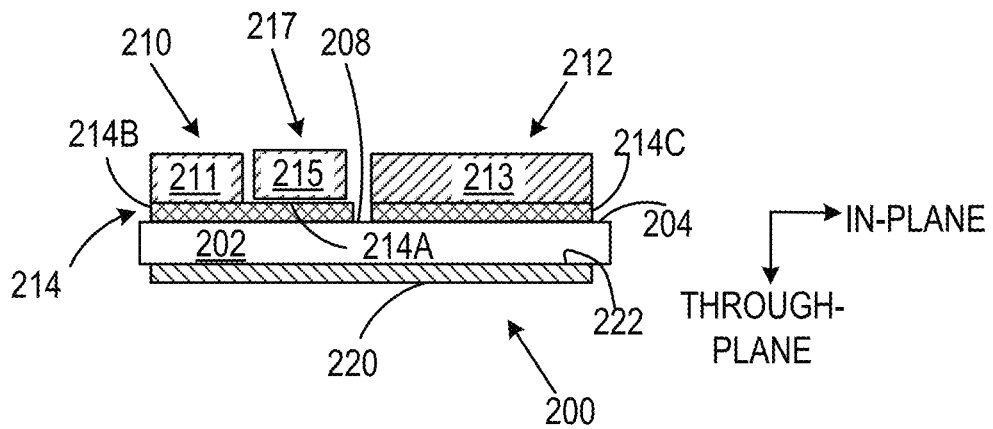

Referring to FIGS. 2A-2B, a representative laser diode submount 200 includes a substrate 202 having a major surface 204 on which a first contact 210, a second contact 212, and a laser bonding contact 217 are defined. A base layer 214 is electrically coupled to the first contact 210 and the laser bonding contact 217, and defines an insulating gap 208 between the base layer 214 and the second contact 212. A perimeter portion 216 of the major surface 204 can remain free of metallization.

As shown in FIG. 2B, the first contact 210 includes one or more upper layers 211 and a portion 214B of the base layer 214 which is situated on the major surface 204 of the substrate 202. The base layer 214 also includes a portion 214A associated with the laser bonding contact 217 and second contact portion 214C associated with the second contact 212. Thus, the first contact 210, the laser bonding contact 217, and the second contact 212 are defined by respective upper layers 211, 215, 213 and portions 214B, 214A, 214C of the base layer 214. An additional layer (or layers) 220 can be provided on an additional (backside) major surface 222 of the substrate 202 for attachment to other components, to provide a thermal path for device temperature control (cooling or heating), additional mechanical support, or other purpose. In some cases, the base layer 214 or portions thereof serves as one or more contacts, and additional metallic or conductive layers such as the upper lasers 211, 215, 213 are not used.

In typical examples, the substrate 202 is single crystal SiC which can have different properties (such as thermal conductivities) in a through-plane direction (perpendicular to the major surface 204 and an in-plane direction parallel to the major surface 202. For some crystalline or ordered substrates, properties can vary along three different axes. An SiC substrate can be arranged so that a larger or smaller thermal conductivity is associated with an in-plane or through-plane direction.

In the example of FIGS. 2A-2B, the first contact 210, the second contact 212, and the laser bonding contact 217 are situated on respective portions of a common base layer (i.e.; the base layer 214), but in other examples, the first contact portion 214B and the second contact portion 214C are portions of different base layers having the same or different thicknesses and/or compositions. In a typical implementation (as shown), the first and second contacts 210, 212 also include the respective portions of the base layer 214 and can be defined by layers such as (Ti—Pt—Au), wherein the Au layer is thick layer, or (Ti—Pt—Cu—Ti—Pt—Au), wherein the Cu layer is a thick layer. The laser bonding contact 217 can also include a portion of the base layer 214 as well as additional AuSn and Au layers for soldering or wirebonding.

Figure 2C:
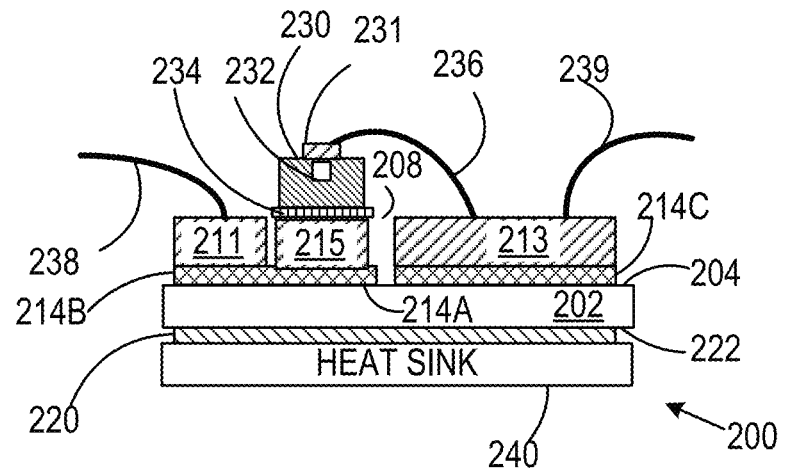

FIG. 2C illustrates the laser diode submount 200 with a laser diode 230 in place. The laser diode 230 includes a light emission region 232 and is secured to the upper layers 215 with a solder layer 234. As shown, a laser beam would be emitted substantially along the gap 208, but other orientations can be used, so that a beam is emitted perpendicular to the gap 208 or at an arbitrary angle. The laser diode 230 is electrically coupled to the first contact 210 via the solder layer 234 and the base layer 214, and to the second contact 214 via a top contact 231 of the laser diode 230 and a bond wire 236. The first contact 210 and the second contact 212 are electrically connected to laser driver and other circuitry with, for example, respective bond wires 238, 239. A heat sink 240 is thermally coupled to the substrate 202 with the additional layer 220.

Example 3. Represented Laser Diode on Submount

Figure 3:
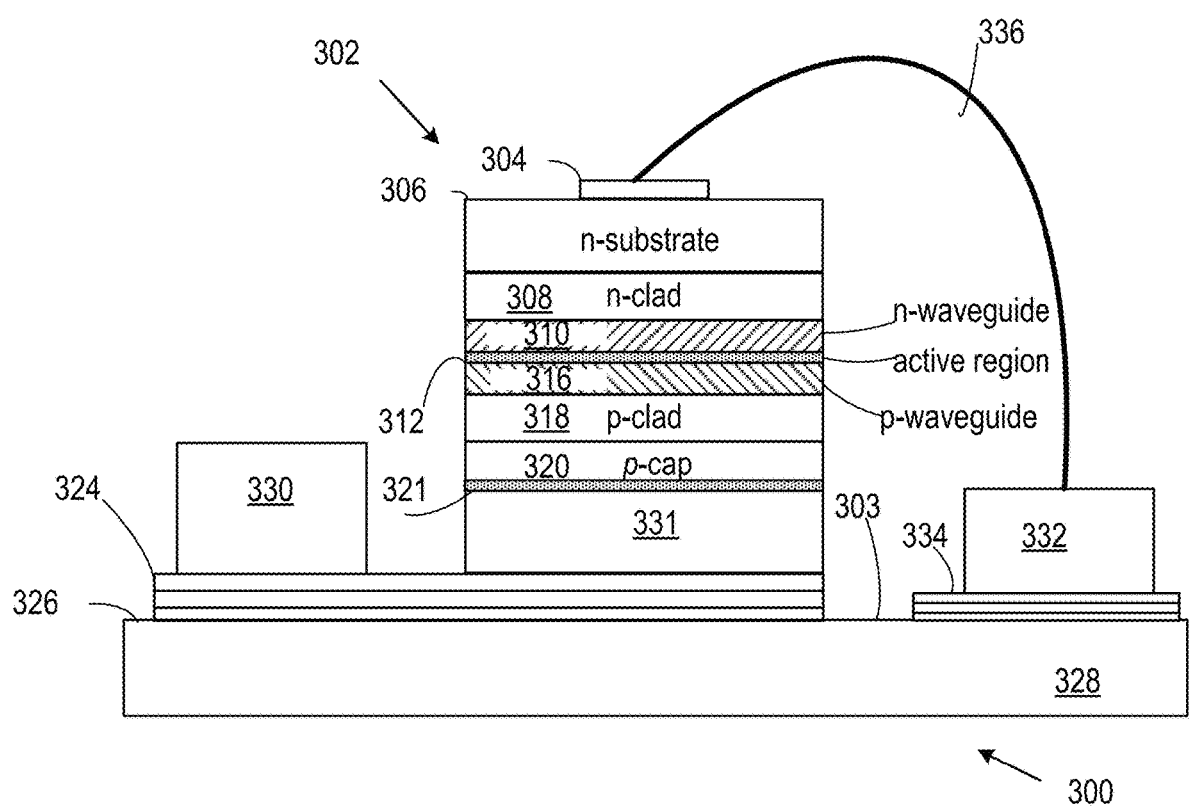
FIG. 3 illustrates a laser diode secured to a submount.

Referring to FIG. 3, a laser diode 302 secured to a submount 300 includes, from a top contact 304 toward the submount 300, an n-substrate layer 306, an n-cladding layer 308, an n-waveguide layer 310, an active region 312, a p-waveguide layer 316, a p-cladding layer 318, and a p-cap 320. A solder layer 321 secures the p-cap 320 to an upper laser bonding contact 331 coupled to a base layer 324 that is situated on a major surface 326 of a submount substrate 328. A first upper contact portion 330 (typically gold) is situated on and electrically coupled to the base layer 324 and a second upper contact portion 332 is situated on and electrically coupled to a base layer 334 which can be the same or different than the base layer 324. A bond wire 336 electrically couples the top contact 304 of the laser diode 302 to the second contact upper portion 334. As shown, the first upper contact portion 330 is electrically coupled to the laser diode 302 via the base layer 324 and the solder layer 321. In the example of FIG. 3, the base layers 324, 334 in combination with the upper portions 330, 331, 332 form contacts for electrical coupling to the laser diode 302. Typically, at least one of the layers associated with the laser bonding contact is thick to promote thermal control.

Example 4. Submount Fabrication

Figure 4:
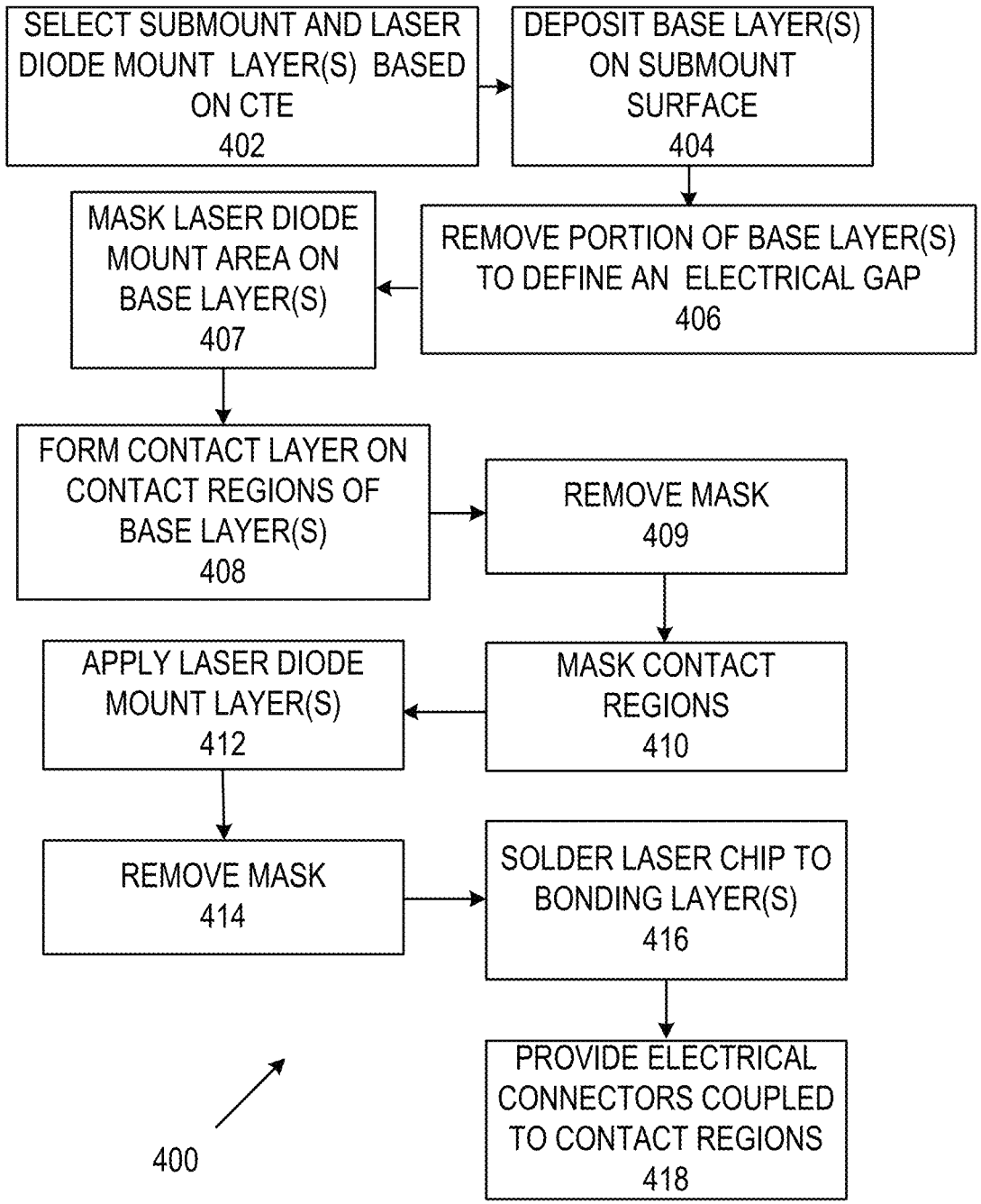
FIG. 4 illustrates a representative method of making a laser submount.

Referring to FIG. 4, a representative method 400 of submount fabrication includes selecting a substrate material and contact layers based on desired CTEs and thermal conductivities at 402. In some cases, an orientation of a submount substrate such as SiC is selected so that a larger or smaller thermal conductivity is in or out of a substrate plane. At 404, a base layer is deposited on a major surface of a submount substrate, and at 406, the base layer is patterned to define an insulating gap between first and second portions of the base layer. A mask material is applied to a laser diode bonding area on the first portion or second portion of the base layer at 407. At 408, contacts are plated or otherwise formed on exposed first and second portions of the base layer. In some examples, the contacts are copper or copper with a gold top layer to facilitate soldering, wirebonding, or other electrical connections. At 409, the mask material is removed, and at 410, the contact areas are masked, leaving a portion of the base layer to be used in laser bonding exposed. Bonding layers are applied at 412 by plating or other processes, and the mask removed at 414. A laser diode is soldered or otherwise secured to the laser diode bonding area at 416. At 418, bond wires are applied to the contact regions as needed to permit coupling to the laser diode.

In this example, plating is used to form contacts, but contacts or other layers can be formed by sputtering, evaporation, plating, chemical vapor deposition, or other techniques. In some cases, etching is used to define insulating gaps, but lift off processes can also be used.

Example 5. Representative Implementation

Figure 5A:
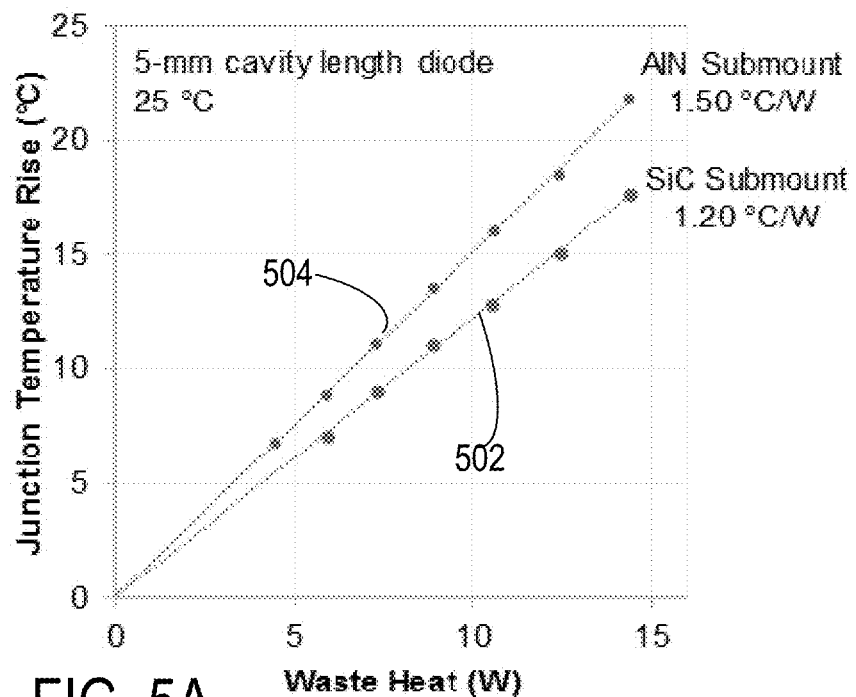
FIGS. 5A-5B illustrate characteristics of laser diodes secured to various submounts.
Figure 5B:
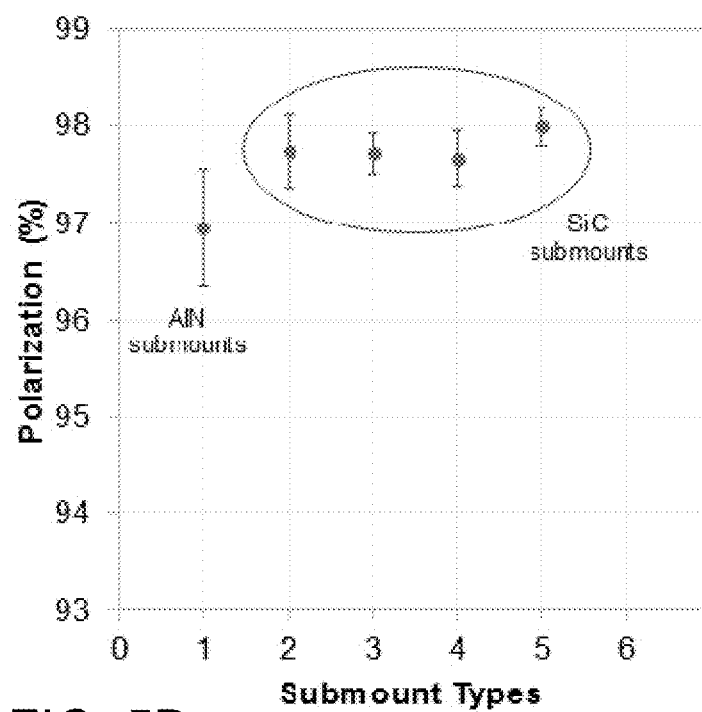

In one example, laser diode junction temperature rise from the heatsink was estimated as a function of total waste heat for a laser diode having a cavity length of 5 mm and operated at a nominal heatsink temperature of 25 C. Estimates are plotted in FIG. 5A for laser diodes mounted to a SiC submount (curve 502) and for laser diodes mounted to an AlN submount (curve 504). Slopes of the curves 502, 504 are about 1.5° C./W and 1.2° C./W for AlN and SiC submounts, respectively, showing that SiC submounts tend to be associated with smaller junction temperature increases. FIG. 5B shows that SiC submounts using thick conductors in a laser bonding contact can provide superior polarization ratios than AlN submounts.

Example 6. Representative Submount with Laser Diode

Figure 6:
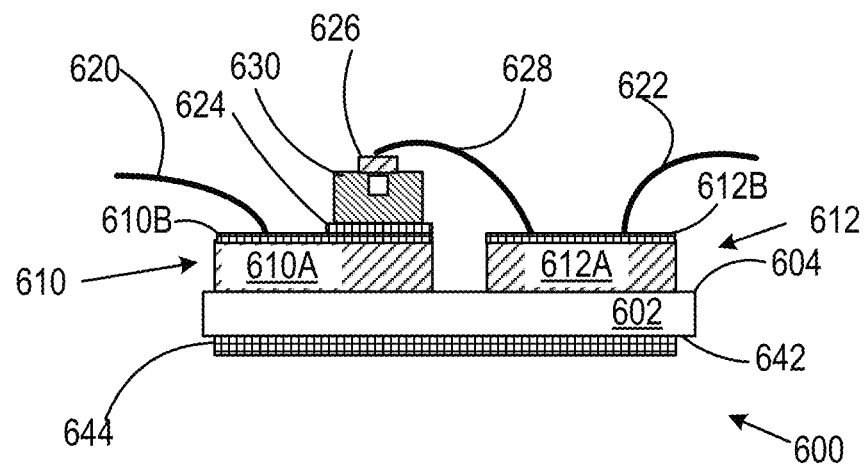
FIG. 6 illustrates a representative arrangement of a laser diode secured to a submount.

Referring to FIG. 6, a laser diode assembly 600 includes a substrate 602 such as a SiC substrate having a major surface 604 with contacts 610, 612. In this example, the contacts 610, 612 each comprise respective copper layers 610A, 612A and bonding layers 610B, 612B, typically gold which is suitable for connection to respective bond wires 620, 622. A laser diode 630 is secured to the contact 610 with a solder layer 624 and a top contact 626 of the laser diode 630 is electrically coupled to the contact 612 with a bond wire 628. Additional layers may be provided to, for example, promote adhesion of the copper layers 610A, 612A to the major surface 604. One or both of the copper layers 610A, 612A can be relatively thick, i.e., at least as thick as 1 µm, 2 µm, 5 µm, 10 µm, 20 µm, 50 µm, or thicker. In further examples, other conductive materials are used instead of copper such as gold, silver, or other metals. A backside surface 642 is provided with a layer 644 that is suitable for use in bonding, soldering, or other connection of the laser diode assembly 600.

Example 7. Representative Submount with Laser Diode

Figure 7:
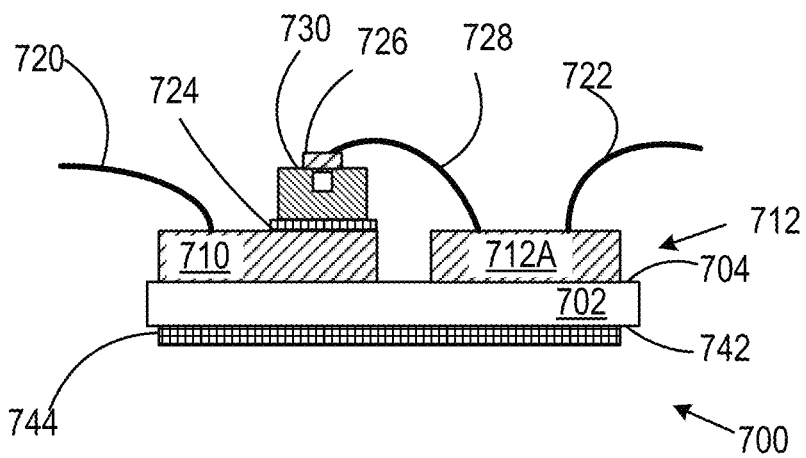
FIG. 7 illustrates another representative arrangement of a laser diode secured to a submount.

Referring to FIG. 7, a laser diode assembly 700 includes a substrate 702 such as a SiC substrate having a major surface 704 with contacts 710, 712. In this example, the contacts 710 and 712 are gold. A laser diode 730 is secured to the contact 710 with a solder layer 724 and a top contact 726 of the laser diode 730 is electrically coupled to the contact 712 with a bond wire 728. As in other examples, a hard solder (AuSn) is preferred. Additional layers may be provided to, for example, promote adhesion of the contact 710 and the gold layer 712 to the major surface 704. The gold contact 710 and the gold layer 712 are typically relatively thick, i.e., at least as thick as 1 µm, 2 µm, 5 µm, 10 µm, 20 µm, 50 µm, or thicker. In further examples, other conductive materials are used instead of gold. A backside surface 744 is provided with a layer 742 that is suitable for use in bonding, soldering, or other connection of the laser diode assembly 700.

Example 8. Representative Submounts with Thick Gold or Thick Copper

In a specific example illustrated in FIGS. 8A-8C, a submount 800 includes a substrate 802 having a major surface 803 on which contacts 804, 806, 810 are formed. The contacts 804, 806 are electrically coupled (and can share some conductive layers) but are spaced apart from the contact 810 with an insulating gap 808, typically a portion of the major surface 803 lacking a conductive coating. A backside surface opposite the major surface 803 includes a contact 812. The contacts 804, 810 can include multiple conductive layers such as (starting from the major surface 803) layers of Ti—Pt—Au having respective thicknesses 100/200/10,000 nm. The outermost gold layer can be used for wirebonding for electrical coupling. The contact 806 can include multiple conductive layers such as (starting from the major surface 803) Ti—Pt—Au—Ti—Pt—AuSn(80%/20% weight ratio)-Au having respective thicknesses 100/200/10,000/40/300/6000/50 nm. The AuSn layer is typically 80% gold and 20% tin by weight and can be used for soldering a laser diode to the submount 800. Other thicknesses of any of these layers can be used, but a relatively thick conductive layer of gold is convenient for a low resistance current path and for laser diode temperature control (often cooling) and outermost layers of gold are convenient for soldering or wirebonding.

Figure 8D:
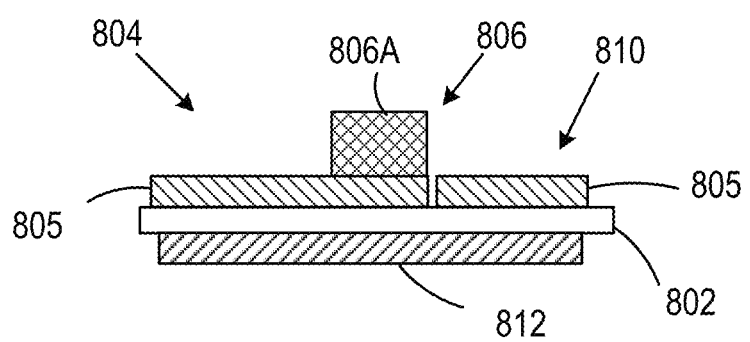

FIG. 8D illustrates a possible construction of the submount 800. As shown, the contact 804 and the contact 810 are defined by portions of a first set of layers 805; the contact 806 is defined by a portion of the first set of layers 805 and an upper set of layers 806A. The backside contact 812 can have the same composition as the first set of layers 805, but is generally thinner. For example, the first set of layers 805 can include Ti—Pt—Au layers of respective thicknesses 100/200/10,000 nm; the second set of layers 806A can be applied to the first set of layers 805 and can include Ti—Pt—AuSn(80%/20% weight ratio)-Au of respective thicknesses 40/300/6000/50 nm. With such construction, the set of layers 805 can be patterned to at least partially define all of the contacts 804, 806, 810.

In other examples, the thick gold layers are replaced with thick copper layers. The contacts 804, 810 can include multiple conductive layers such as (starting from the major surface 803) layers of Ti—Pt—Cu—Ti—Pt—Au having respective thicknesses 100/200/15,000/100/200/1000 nm. The outermost gold layer can be used for wirebonding for electrical coupling. The contact 806 can include multiple conductive layers such as (starting from the major surface 803) Ti—Pt—Cu—Ti—Pt—Au—Pt—AuSn—Au having respective thicknesses 100/200/15,000/100/200/1000/40/300/6000/50 nm.

Example 9. Representative Submount with Thick Copper and Gold

Figure 9A:
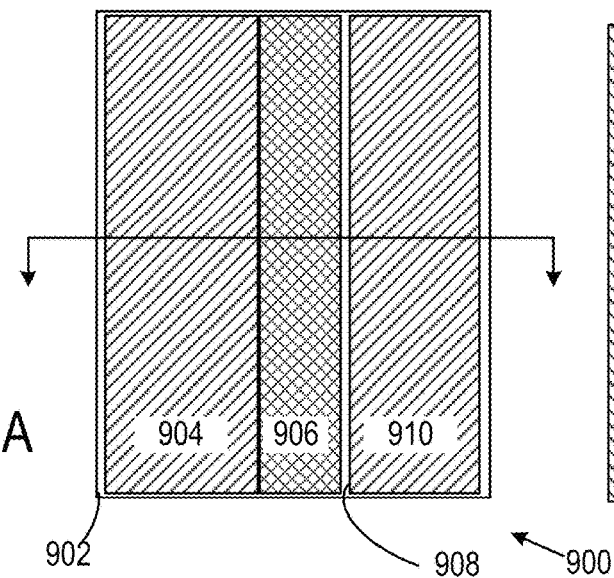
FIGS. 9A-9C illustrate a representative laser submount.
Figure 9C:
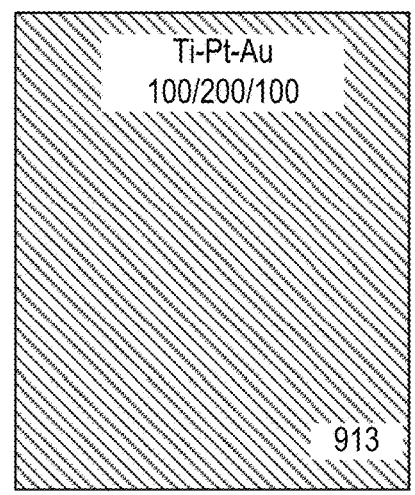
Figure 9B:
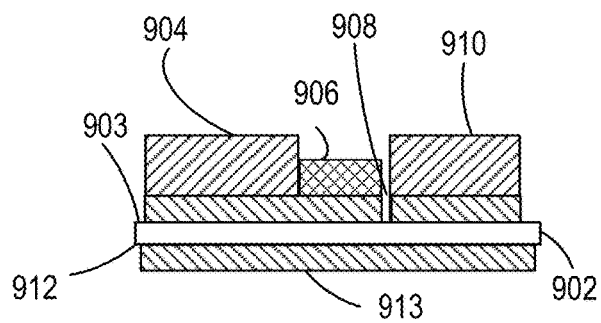

In a specific example illustrated in FIGS. 9A-9C, a submount 900 includes a substrate 902 having a major surface 903 on which contacts 904, 906, 910 are formed. The contacts 904, 906 are electrically coupled (and can share some conductive layers) but are spaced apart from the contact 910 with an insulating gap 908, typically a portion of the major surface 903 lacking a conductive coating. A backside surface 912 opposite the major surface 903 includes one or more layers 913. The contacts 904, 910 can include multiple conductive layers such as (starting from the major surface 903) layers of Ti—Pt—Au—Ti—Pt—Cu—Ti—Pt—Au having respective thicknesses 100/200/10,000/100/200/10,000/100/200/1000 nm. In some examples, thick layers of gold or copper can be 1-1,000 µm or thicker. The outermost gold layer can be used for wirebonding for electrical coupling. The contact 906 can include multiple conductive layers such as (starting from the major surface 903) Ti—Pt—Au—Ti—Pt—AuSn(80%/20% weight ratio)-Au having respective thicknesses 100/200/10,000/40/300/6000/50 nm. The AuSn layer is typically 80% gold and 20% tin by weight and can be used for soldering a laser diode to the submount. Other thicknesses of any of these layers can be used, but a relatively thick conductive layer of copper is convenient for laser diode temperature control (often cooling) and outermost layers of gold are convenient for soldering or wirebonding.

Example 10. Combined Beam Systems

Figure 10A:
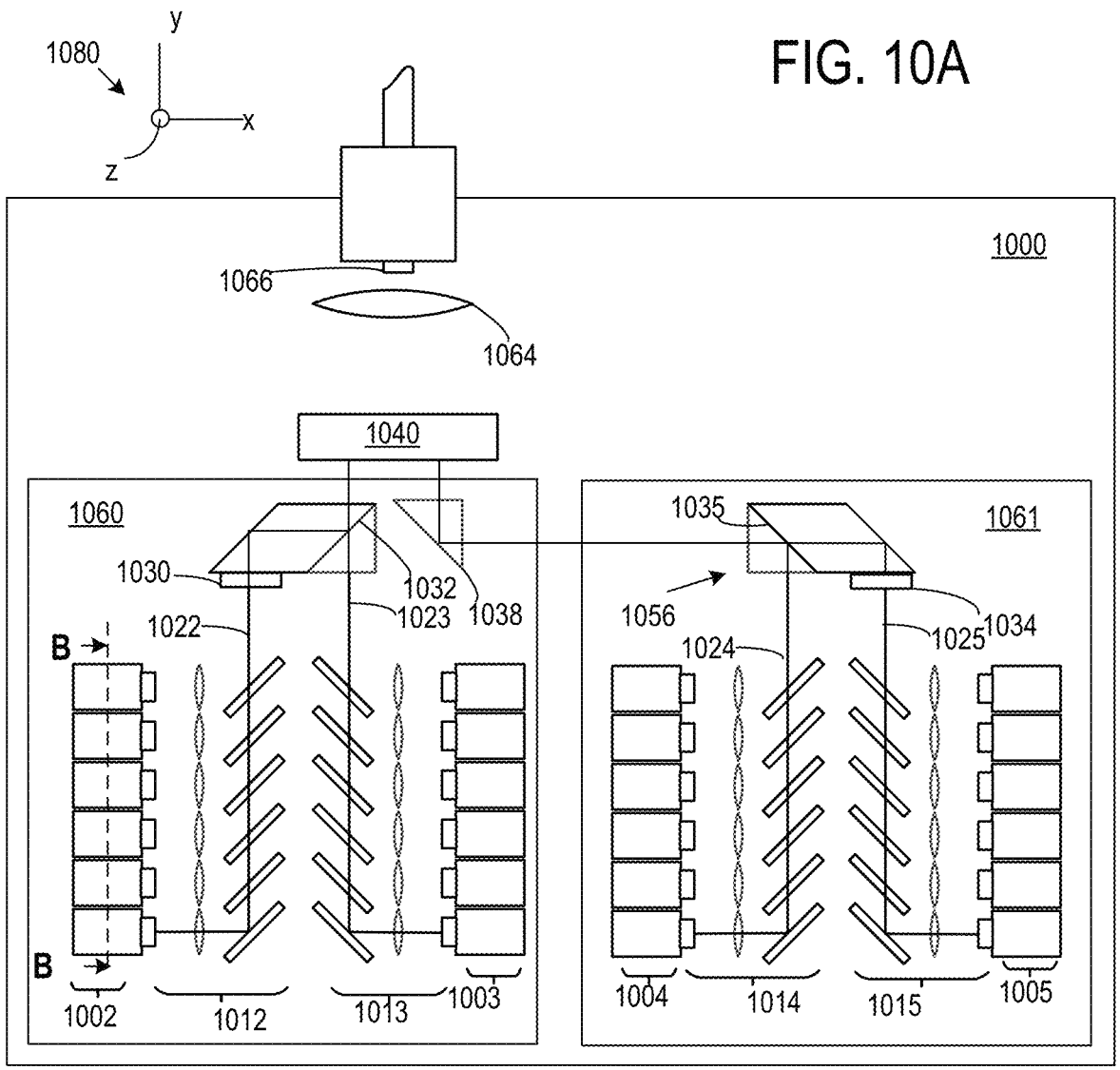
FIGS. 10A-10B illustrate a laser diode assembly in which two beam stacks based on laser diodes secured to submounts as disclosed herein are formed using polarization multiplexing, and the two beam stacks compressed using a beam compressor.
Figure 10B:
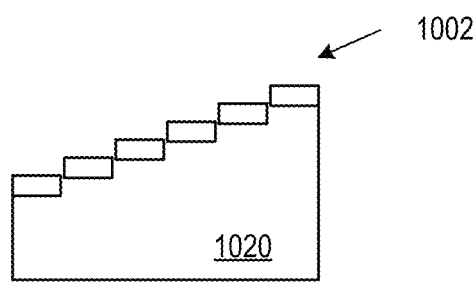

Beams from a plurality of laser diodes secured to submounts such as disclosed herein can be combined in various ways. With reference to FIGS. 10A-10D, a diode laser assembly 1000 is described with reference to a right-handed xyz coordinate system 1080 in which a z-axis extends upwardly out of the plane of FIG. 10A. The diode laser assembly 1000 includes sets of laser diodes 1002-1005 secured to respective submounts to emit respective sets of laser beams to corresponding sets of reflectors and fast and slow axis collimators 1012-1015. For example, the set 1002 of laser diodes emits beams along an x-axis direction that are then redirected by respective reflectors of the set 1012 so as to propagate along a y-axis direction. The laser diodes associated with each set are displaced or offset from other laser diodes of the same set along a z-axis and the associated reflectors situated so that laser beams from the set are not blocked by the reflectors. As shown in FIG. 10B, the set of laser diodes 1002 is secured via the submounts to a stepped mount 1020 to provide suitable z-axis offsets; similar stepped mounts are provided for the remaining sets of laser diodes. The submounts to which the sets of lasers are secured are fixed to respective stepped mounts which can provide a thermal path for laser diode temperature control. For convenience, beam propagation axes 1022-1025 are shown for the bottom-most laser diodes of each set; beam propagation axes for the remaining laser diodes of each set are similar, but displaced along the z-axis.

The laser beams from the set of laser diodes 1002 are directed to a half-wave retarder 1030 and then combined with the laser beams from the set of laser diodes 1003 at a polarizing beam splitter 1032 so that a vertically stacked set of beams (i.e., stacked along the z-axis) is incident to a beam spacing compressor 1040 that can be provided as a pair of cylindrical lenses or a single cylindrical meniscus lens. The laser beams from the set of laser diodes 1005 are directed by reflectors of the set 1015 to a to a half-wave retarder 1034 and then combined with the laser beams from the set of laser diodes 1004 as redirected by reflectors of the set 1014 at a polarizing beam splitter 1035 so that a vertically stacked set of beams is incident to the beam compressor 1040.

Example 11. Representative Submount Fabrication

Figure 11:
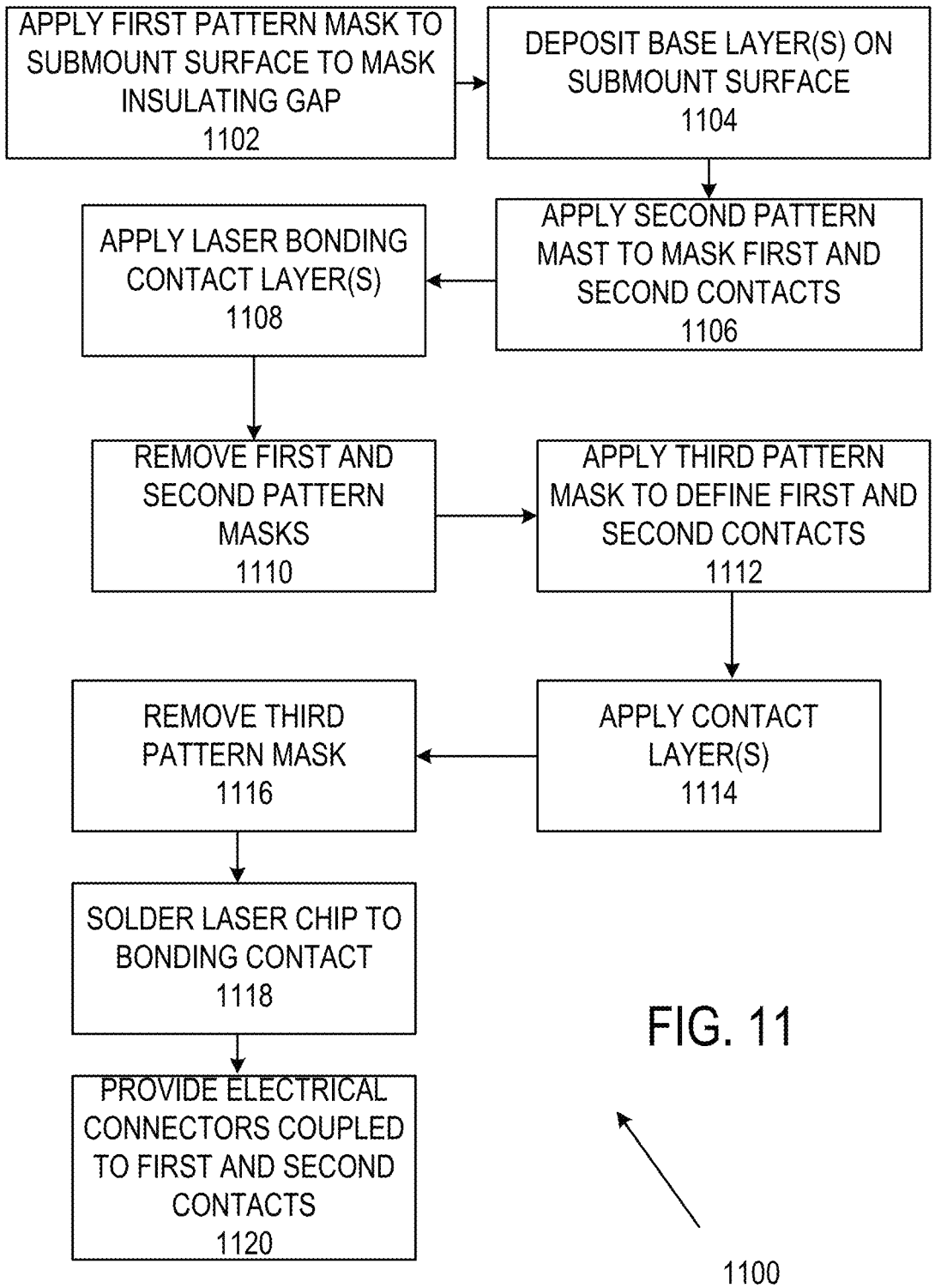
FIG. 11 illustrates a method of making a submount and securing a laser diode to the submount.

Referring to FIG. 11, a method 1100 includes applying a first pattern mask to a submount to mask an area corresponding to an insulating gap at 1102. At 1104, base layers are deposited by plating, evaporation, sputtering or other processes; the mask will be removed subsequently to remove base layer portions at the gap in a lift-off process. At 1106, a second pattern mask is applied to mask regions associated with first and second contacts. Laser bonding contact layers are applied at 1108, and the first and second pattern masks are removed at 1110. At 1112, a third pattern mask is applied to define a first and second contacts and the associated layers are applied at 1114. The third pattern mask is removed at 1116. The laser is soldered or otherwise bonded to the laser bonding contact at 1118 and electrical connections such as bond wires are applied to the first and second contacts at 1120.

Example 12. Mounted Laser Diode with Selected Substrate/Layer Thicknesses

Figure 12:
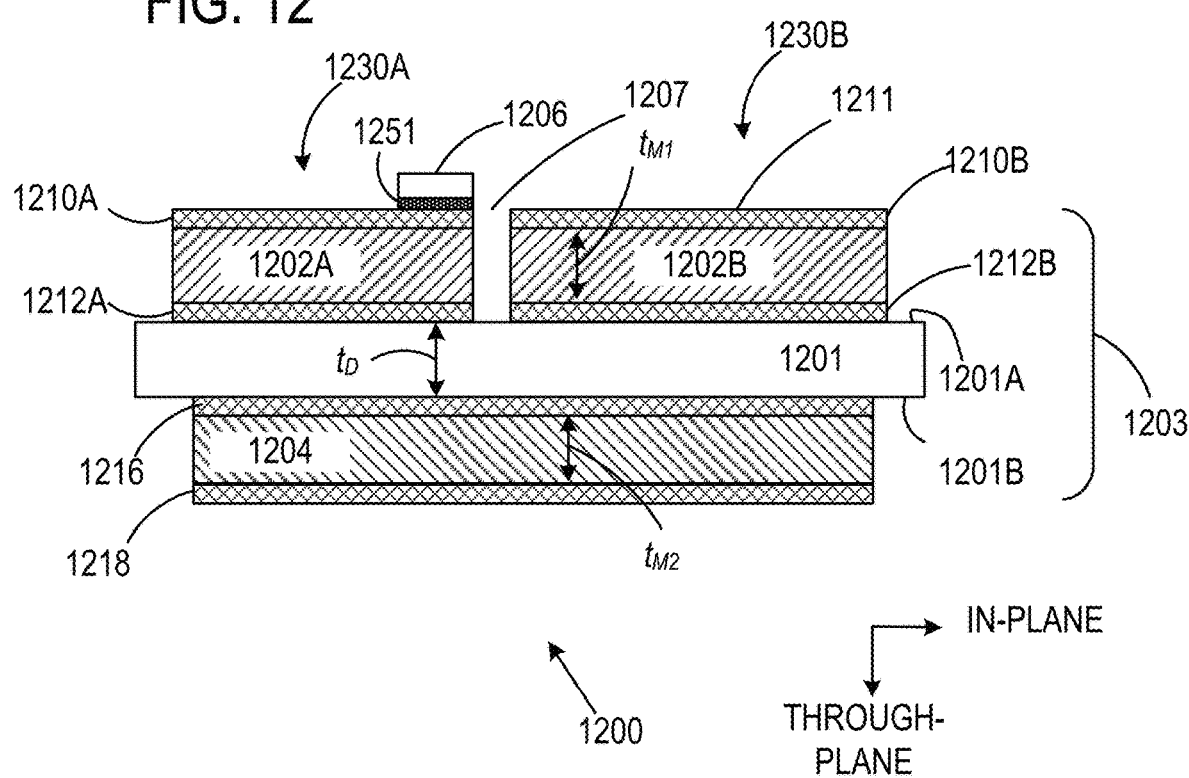
FIG. 12 illustrates another representative laser submount.

Referring to FIG. 12, a representative mounted laser diode assembly 1200 includes a submount 1203 formed with a substrate 1201. A first contact 1230A and a second contact 1230B are defined on a major surface 1201A of the substrate 1201 by, from a topmost surface 1211 to the major surface 1201A, top conductive layer(s) 1210A, 1210B, thick conductor layer(s) 1202A, 1202B, and bottom conductor layer(s) 1212A, 1212B, respectively. These layers can be formed as parts of larger layers that are etched to produce a gap 1207 or the gap 1207 can be produced by lift-off or other processes. The top conductor layers 1210A, 1210B can have the same or different compositions and thicknesses, and each can include a plurality of layers of different materials. In addition, the top layers 1210A, 1210B typically have a topmost surface of gold or other material suitable for wire bonding or soldering to serve as bond pads. As shown, a solder layer 1251 secures a laser diode 1206 to the layer(s) 1210A. The layer(s) 1212A, 1212B are generally selected to promote bonding and adhesion to the major surface 1201. The layer(s) 1202A typically include a thick (>1, 2, 5, 10, 20, 50, 100 µm) conductive layer, and the layer(s) that support the laser 1206 can be different from the layer(s) 1210A, 1212A, 1202A but such different construction is not shown in FIG. 12. Conductive layers 1216, 1204, 1218 are situated on a back side surface 1201B of the substrate 1201 for attachment to other supports and for compensating thermal stresses associated with layers on the major surface 1201A.

While thickness of any particular layer is generally in a range of from 100 nm to 100 µm, preferred SiC substrate thicknesses can be obtained as follows:

$$t_S = t_{M1}\left(\frac{E_S}{E_{M1}}\right)\left(\frac{CTE_{M1} - CTE_C}{CTE_C - CTE_S}\right) + t_{M2}\left(\frac{E_S}{E_{M2}}\right)\left(\frac{CTE_{M2} - CTE_C}{CTE_C - CTE_S}\right),$$

wherein $t_S$ is a thickness of the SiC layer, $t_{M1}$ is a thickness of the first metal layer, $t_{M2}$ is a thickness of a second metal layer, $E_{DS}$ is a Young's modulus of the SiC layer, $E_{M1}$ is a Young's modulus of the first metal layer, $E_{M2}$ is a Young's modulus of the second metal layer, $CTE_S$ is a coefficient of thermal expansion of the SiC layer, $CTE_{M1}$ and $CTE_{M2}$ are coefficients of thermal expansion of the first and second metal layers, respectively, and $CTE_C$ is the coefficient of thermal expansion of the surface of the multilayered structure. Representative material properties are summarized in the table below.

| Submount Material Properties | | | |
|---|---|---|---|
| Material | Thermal Cond. (k) (W/m-K) | CTE (α) (K$^{-1}$) | Young's Modulus (E) (GPa) |
| Crystal SiC (4H or 6H) | 490 (⊥ to c-axis) 390 (∥ to c-axis) | 4.3 × 10$^{-6}$ (⊥ to c-axis) 4.7 × 10$^{-6}$ (∥ to c-axis) | 700 |
| Copper | 390 | 16.5 × 10$^{-6}$ | 110 |
| Gold | 310 | 14 × 10$^{-6}$ | 79 |
| GaAs | | 5.9 × 10$^{-6}$ | |

Contributions of relatively thin layers (less than 1 µm, 500 nm, 250, nm, 100 nm, or 50 nm) are generally neglected. For thick layers that include multiple materials, a weighted average of material constants can be used. In some cases, submounts have thick metal on only the major surface (i.e., $t_{m1}$=thick metal thickness and $t_{m2}$=0); in other examples, the substrate is sandwiched between nominally identical thick metal layers and $t_{m1}$=$t_{m2}$=$t_m$, wherein $t_m$ is layer thickness.

Figure 13:
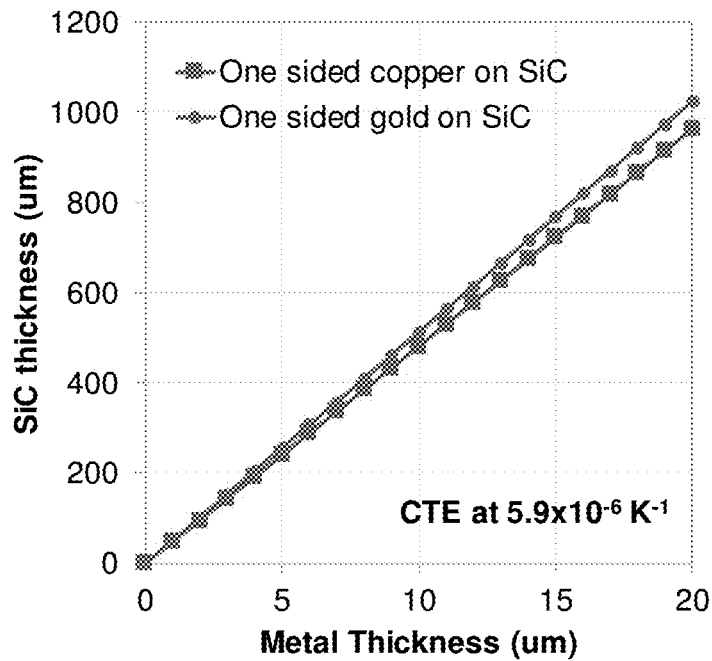
FIG. 13 shows preferred thicknesses of SiC and copper/gold in a SiC submount with thick metal on one side to CTE-match that of GaAs.
Figure 14:
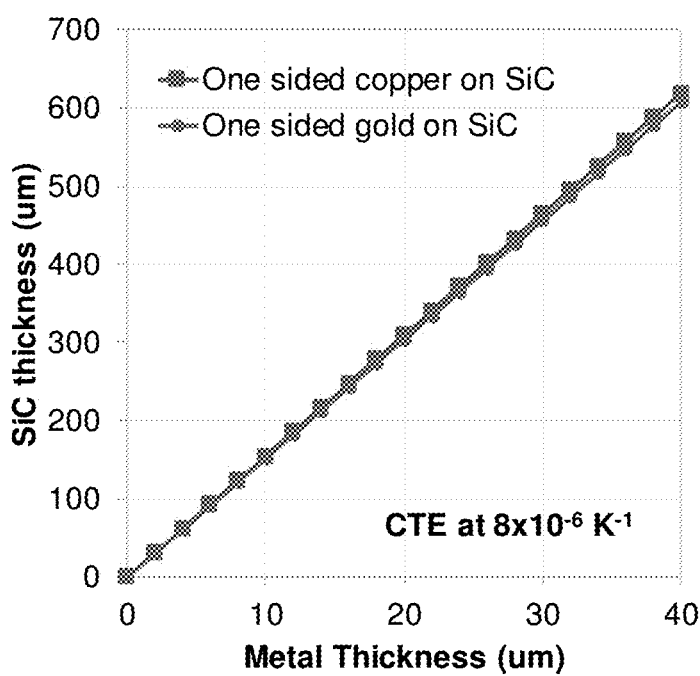
FIG. 14 shows preferred thicknesses of SiC and copper/gold in a SiC submount with thick metal on one side to quasi CTE-match that of GaAs.

Examples of preferred SiC substrate thickness as a function of (thick) metal thicknesses are shown in FIGS. 13-14. FIG. 13 shows thicknesses of SiC and copper/gold in a SiC submount with thick metal on one side to CTE-match that of GaAs (CTE=5.9×10$^{-6}$ K$^{-1}$). FIG. 14 shows relative thicknesses of SiC and copper/gold in a SiC submount with thick metal on one side to quasi CTE-match that of GaAs (CTE=8×10$^{-6}$ K$^{-1}$).

In view of the many possible embodiments to which the principles of the disclosed technology may be applied, it should be recognized that the illustrated embodiments are only preferred examples and should not be taken as limiting. We therefore claim all that comes within the scope of the appended claims.

We claim:

1. A laser diode submount, comprising:
a thermally conductive, insulating substrate; and
a first contact that comprises a first upper contact portion and a portion of a first base layer, a second contact that comprises a second upper contact portion and a portion of a second base layer, and a bonding contact situated between the first contact and the second contact, the bonding contact comprising an upper laser contact portion and a portion of the first base layer, wherein the first base layer and the second base layer are conductive layers situated at a major surface of the substrate, wherein the first upper contact portion and the upper laser contact portion are displaced from each other along the major surface to define a first gap, the second upper contact portion and the upper laser contact portion are displaced from each other along the major surface to define a second gap, the first contact and the bonding contact are electrically coupled to each other by the first base layer and insulated from the second contact, and the bonding contact includes a thermally conductive layer of thickness of at least 0.5 µm.

2. The laser diode submount of claim 1, wherein the substrate is silicon carbide.

3. The laser diode submount of claim 2, wherein the substrate is single crystal silicon carbide.

4. The laser diode submount of claim 1, wherein the thermally conductive layer is gold.

5. The laser diode submount of claim 1, wherein the thermally conductive layer is copper.

6. The laser diode submount of claim 1, wherein the common base layer comprises layers of titanium, platinum, and gold.

7. The laser diode submount of claim 6, wherein the bonding contact terminates with an AuSn layer.

8. The thermally conductive, insulating substrate of claim 1, wherein the first contact, the second contact, and the bonding contact are side by side rectangular contacts that substantially cover the major surface of the substrate.

9. A device, comprising:
a silicon carbide substrate having a major surface;
first conductive contact layers that include a first upper contact portion and a portion of a first base layer and second conductive contact layers that include a second upper contact portion and a portion of a second base layer situated on the major surface, the first conductive contact layers and the second conductive contact layers separated by a first insulating gap and defining a first contact and a second contact that are displaced along the major surface;
a bonding contact that includes an upper laser contact portion and a portion of the first base layer situated on the major surface of the silicon carbide substrate, wherein the upper laser contact portion is displaced from the first upper contact portion by a second insulating gap, and conductively coupled to the first conductive contact layers, the bonding contact including at least one conductive layer of thickness greater than 0.5 μm; and
a laser diode secured and electrically coupled to the bonding contact.

10. The device of claim 9, further comprising a solder layer that secures the laser diode to the bonding contact.

11. The device of claim 9, wherein the first conductive contact layers and second conductive contact layers include a common set of conductive base layers.

12. The device of claim 11, wherein the common set of conductive base layers includes layers of Ti, Pt, and Au.

13. The device of claim 12, wherein a thickness of the Au layer of the common set of conductive base layers is greater than 0.5 μm.

14. The device of claim 11, wherein the common set of conductive layers includes a copper layer having a thickness greater than 0.5 μm.

15. The device of claim 9, wherein the first conductive contact layers and the second conductive contact layers include at least one layer of gold and one layer of copper, each of thickness greater than or equal 0.5 μm.

16. The device of claim 9, wherein the first conductive contact layers and the second conductive contact layers include, from the major surface of the substrate, layers of Ti, Pt, and Au, wherein the Au layer has a thickness of at least 1 μm.

17. The device of claim 16, wherein the bonding contact includes layers of Ti, Pt, and Au, and a thickness of the Au layer is greater than 0.5 μm.

18. A method, comprising:
forming a first set of conductive base layers on a major surface of a SiC substrate, the first set of conductive base layers defining an insulating gap between a first area and a second area of the major surface; and
defining a first contact and a second contact in a second set of conductive base layers by forming the second set of conductive base layers to cover a portion of the first set of conductive base layers associated with the first area of the major surface, wherein the covered portion is not adjacent the insulating gap between the first area and the second area of the major surface and to cover the portion of the first set of conductive base layers associated with the second area of the major surface, wherein the first set of conductive base layers includes layers of Ti, Pt, and Au and the second set of conductive base layers has a thickness of at least 5 μm.

19. The method of claim 18, further comprising bonding and electrically coupling at least one laser diode to an uncovered portion of the first set of base layers associated with the first area of the major surface.

20. The method of claim 18, wherein the first set of conductive base layers includes a Ti layer of thickness of 0.1 μm, a Pt layer of thickness 0.2 μm, and an Au layer of thickness of 10 μm, and the second set of conductive base layers includes an Au layer, a Cu layer, or an AuSn layer.

21. The method of claim 18, wherein the first contact, the second contact, and an uncovered portion of the first set of conductive base layers associated with the first area of the major surface of the substrate are rectangular areas covering the major surface of the substrate except at the insulating gap.

* * * * *